United States Patent
Ito (10) Patent No.: US 8,023,723 B2
(45) Date of Patent: Sep. 20, 2011

(54) MASK PATTERN DIMENSIONAL INSPECTION APPARATUS AND METHOD

(75) Inventor: Masamitsu Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 519 days.

(21) Appl. No.: 12/268,003

(22) Filed: Nov. 10, 2008

(65) Prior Publication Data

US 2009/0123058 A1    May 14, 2009

(30) Foreign Application Priority Data

Nov. 12, 2007  (JP) ................................. 2007-293580

(51) Int. Cl.
*G06K 9/00* (2006.01)
(52) U.S. Cl. ...................................................... 382/144
(58) Field of Classification Search .................... 382/144
See application file for complete search history.

(56) References Cited

U.S. PATENT DOCUMENTS

| | | | |
|---|---|---|---|
| 7,313,781 B2 * | 12/2007 | Asano et al. ................. | 716/52 |
| 2006/0245636 A1 | 11/2006 | Kitamura et al. | |
| 2007/0105243 A1 | 5/2007 | Nagatomo et al. | |
| 2007/0150850 A1 | 6/2007 | Itoh | |
| 2008/0028361 A1 | 1/2008 | Yamanaka et al. | |

OTHER PUBLICATIONS

Kariya et al.; "Mask Pattern Quality Assurance Based on Lithography Simulation With Fine Pixel SEM Image"; Proceedings of SPIE, vol. 5992, pp. 59921M-1-59921M-8, (2005).

* cited by examiner

*Primary Examiner* — Roy M Punnoose
(74) *Attorney, Agent, or Firm* — Finnegan, Henderson, Farabow, Garrett & Dunner, L.L.P.

(57) ABSTRACT

A sidewall shape correction function is determined in advance which represents the relationship of the difference between contour positions of two or more items of pattern contour position data of different thresholds obtained from an SEM image and optical pattern contour positions determined through an optical method. Two or more items of pattern contour position data of different thresholds are obtained from SEM image data on which a lithographic simulation is to be conducted. Pseudo-optical pattern contour position data are determined from the contour position difference and the sidewall shape correction function. A lithographic simulation is conducted using the pseudo-optical pattern contour position data.

20 Claims, 5 Drawing Sheets

MASK PATTERN DIMENSIONAL INSPECTION APPARATUS AND METHOD

CROSS-REFERENCE TO RELATED APPLICATIONS

This application is based upon and claims the benefit of priority from prior Japanese Patent Application No. 2007-293580, filed Nov. 12, 2007, the entire contents of which are incorporated herein by reference.

BACKGROUND OF THE INVENTION

1. Field of the Invention

The present invention relates to a method of inspecting the dimensions of a mask pattern of a photomask and a mask pattern dimensional inspection apparatus using this method.

2. Description of the Related Art

In recent years, various problems are becoming apparent in the photolithographic process used in the manufacture of semiconductor devices. As the dimensions of semiconductor devices have been scaled down, the demand has increased for fine patterning in the photolithographic process. The device design rules have already been scaled down to 45 nm. It is severely required that the accuracy of pattern dimensions be controlled below 5 nm. Furthermore, the mask pattern is formed into a very complex shape because of proximity-effect correction. For this reason, conventional one-dimensional dimensional uniformity inspection, such as mere measurements of the width of pattern lines and the diameter of holes, is insufficient and two-dimensional dimensional control is required. To meet the requirement, a method has been adopted which inspects whether or not a mask pattern has been finished to desired dimensions by converting the mask pattern into image data through SEM, extracting the pattern contour from the image data and conducting a lithographic simulation to determine whether a desired lithographic margin is obtained or not (see "Mask pattern quality assurance based on lithographic simulation with fine pixel SEM image" by M. Kariya et al, Proceedings of SPIE Vol. 5992).

The greatest merit of this method is that the finish of a mask pattern can be evaluated in a state very close to conditions in which the mask pattern is actually used to expose a wafer in a semiconductor manufacturing process. That is, the method can provide necessary and sufficient dimensional control and neither unnecessarily stringent dimensional control nor soft dimensional control.

However, in more stringent mask dimensional control nowadays, an insufficient point in terms of accuracy has emerged in the method as well. This is that the numerical aperture of wafer exposure apparatus has become large and the influence of sidewall shapes of mask pattern has become unnegligible. Specifically, the sidewall shapes of mask pattern vary according to the coverage of the mask pattern and positions in the mask plane. For this reason, trying to extract pattern contour data from SEM image data while neglecting sidewall shapes as in the conventional method has resulted in a case where the result of lithographic simulation using the contour data and the result of the actual exposure of wafer do not match.

It is generally known that the optical approach to obtain mask pattern contour data can provide accurate contour positions that better match the result of actual exposure of wafer than with the approach to obtain contour data from SEM image data. However, the optical approach is very laborious and hence the incorporation of it into the semiconductor device manufacturing process is not practical. In contrast, the approach to obtain pattern contour data from SEM image data can be easily implemented incorporated into the manufacturing process. However, when lithographic simulation is conducted using pattern contour data obtained by the conventional method, the result does not match the result of actual exposure of wafer. It is therefore difficult to accurately inspect the finish of a mask pattern.

The mask pattern dimensional inspection method of the invention involves previously determining a sidewall shape correction function representing the relationship of the difference between contour positions of two or more items of pattern contour position data of different thresholds obtained from an SEM image and optical pattern contour positions determined through an optical method, obtaining two or more items of pattern contour position data of different thresholds from SEM image data on which a lithographic simulation is to be conducted, determining pseudo-optical contour position data from the contour position difference and the sidewall shape correction function, conducting a lithographic simulation using the pseudo-optical contour position data, and evaluating whether or not a desired exposure margin is obtained on the basis of the result of the lithographic simulation.

BRIEF SUMMARY OF THE INVENTION

According to an aspect of the invention, there is provided a mask pattern dimensional inspection method comprising: preparing a sidewall shape correction function by, using an optical method, determining contour position data of a plurality of mask patterns which are different in sidewall shape and formed on a photomask as optical contour position data, obtaining SEM image data of the mask patterns, obtaining a plurality of items of pattern contour position data corresponding to the mask patterns from the SEM image data using a first threshold, determining an offset between the pattern contour position data obtained for each of the mask patterns using the first threshold and the corresponding optical contour position data, obtaining two items of pattern contour position data from the SEM image data for each of the mask patterns using second and third thresholds, obtaining contour position difference data between the two items of pattern contour position data obtained for each of the mask patterns using the second and third thresholds, and determining the sidewall shape correction function representing the correspondence between the offset and the contour position difference data obtained for each mask pattern; obtaining an SEM image of a pattern to be inspected; obtaining pattern contour position data from the SEM image of the pattern to be inspected using the first, second and third thresholds; obtaining position contour position difference data between two items of pattern contour position data obtained from the SEM image of the pattern to be inspected using the second and third thresholds; obtaining an offset corresponding to the pattern contour position difference data by referring to the sidewall shape correction function; determining pseudo-optical contour position data by adding the resulting offset to the pattern contour position data obtained from the SEM image of the pattern to be inspected using the first threshold; and conducting a lithographic simulation of the pattern to be inspected using the pseudo-optical contour position data.

DETAILED DESCRIPTION OF THE INVENTION

An embodiment of the present invention will be described hereinafter with reference to the accompanying drawings.

Figure 1:
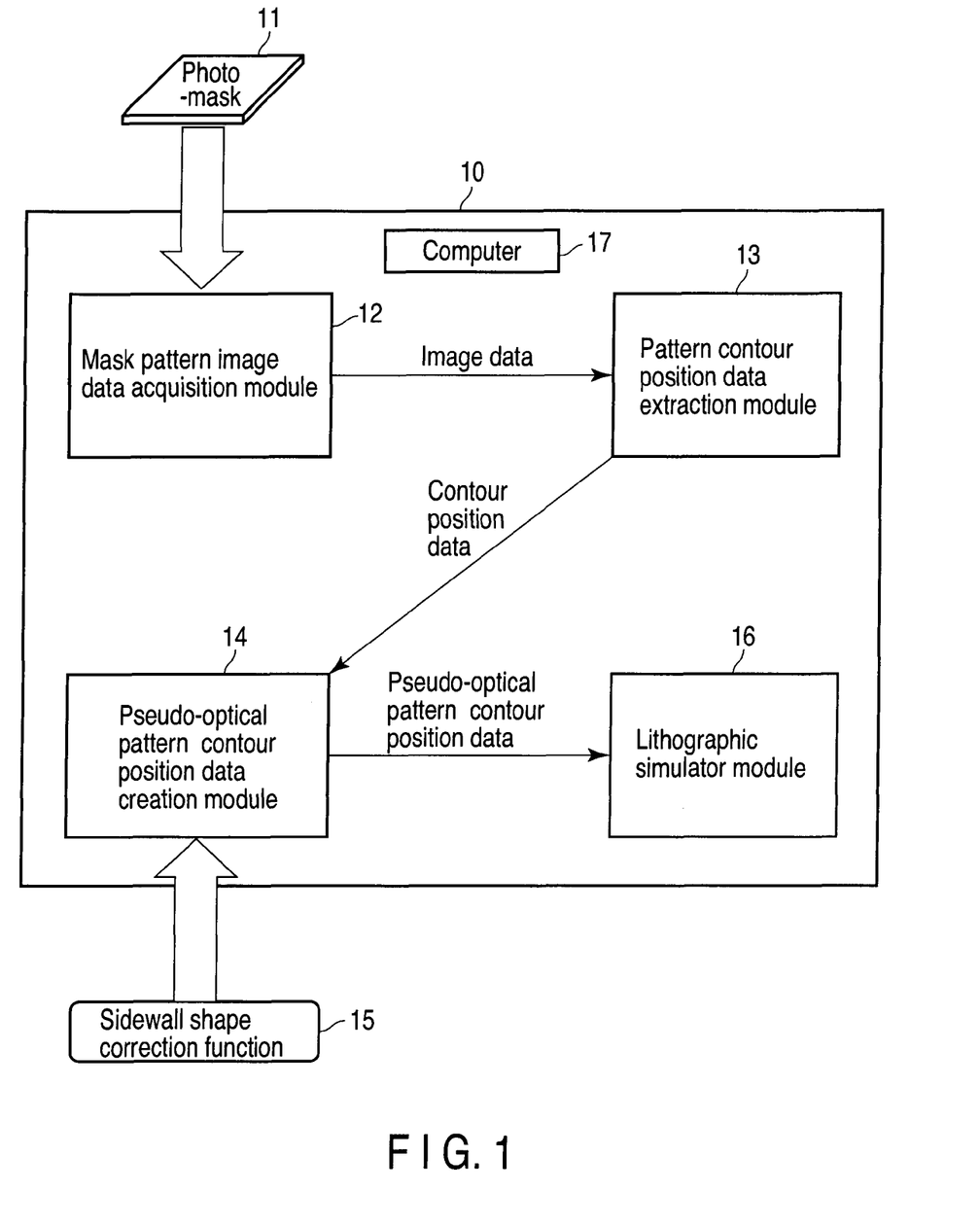
FIG. 1 is a schematic block diagram of a mask pattern dimensional inspection apparatus for implementing a mask pattern dimensional inspection method according to the present invention.

First, reference is made to FIG. 1 to briefly describe the block configuration and operation of an embodiment of a mask pattern inspection apparatus configured to carry out a mask pattern dimensional inspection method of the present invention. In FIG. 1, a photomask 11, which is the subject of inspection or is used to determine a sidewall shape correction function to be described later, is prepared for the mask pattern dimensional inspection apparatus 10. The photomask 11 is set in a mask pattern image data acquisition module 12 that contains a scanning electron microscope (SEM) apparatus to convert mask patterns on a photomask into image data. The resulting image data for mask patterns on the photomask 11 which is the subject of inspection by way of example is applied to a pattern contour extraction module 13, where contour position data representing only the contours of the mask patterns are extracted from the image data and then applied to a quasi-optical pattern contour position data production module 14. This quasi-optical pattern contour position data production module 14 converts the contour data obtained from the SEM image data into quasi-optical contour position data, which is comparable in accuracy to optical contour data obtained by a standard optical method, through the use of sidewall shape correction function data prepared in advance in a memory module 15. The resultant quasi-optical contour position data is applied to a lithographic simulator module 16, where a given lithographic simulation is carried out to determine whether or not a desired lithographic tolerance can be obtained. This allows inspection of the dimensions of or evaluation of the patterns on the photomask. The mask pattern dimensional inspection apparatus 10 has a computer 17 built in to control the operation of the entire apparatus including the operation of the memory module 15.

The configuration and operation of the mask pattern dimensional inspection apparatus shown in FIG. 1 will be described in detail below with reference to FIGS. 2 through 8.

First, a description is given of a method of preparing the sidewall shape correction function mentioned in conjunction with FIG. 1 in the memory module 15. For example, the sidewall shape correction function can be obtained in step S1 of FIG. 2 in accordance with the method to be described below through the use of the computer 17 set in the apparatus shown in FIG. 1.

In creating the sidewall shape correction function, contour position data of a plurality of mask patterns with different sidewall shapes formed on the photomask 11 prepared for creating the function are first determined as optical contour position data in accordance with an optical method using an optical apparatus not shown. On the other hand, SEM image data of the mask patterns are obtained using the SEM apparatus constituting the pattern contour position data extraction module 12 shown in FIG. 1. Next, a plurality of items of pattern contour position data are obtained from the SEM image data of the mask patterns using a first threshold in the pattern contour position data extraction module 13. The detail of the method of obtaining the contour position data using the first threshold will be described later with reference to FIG. 6. The offset between the pattern contour position data and the optical contour position data is determined for each mask pattern, which will also be described later with reference to FIG. 6.

Figure 8:
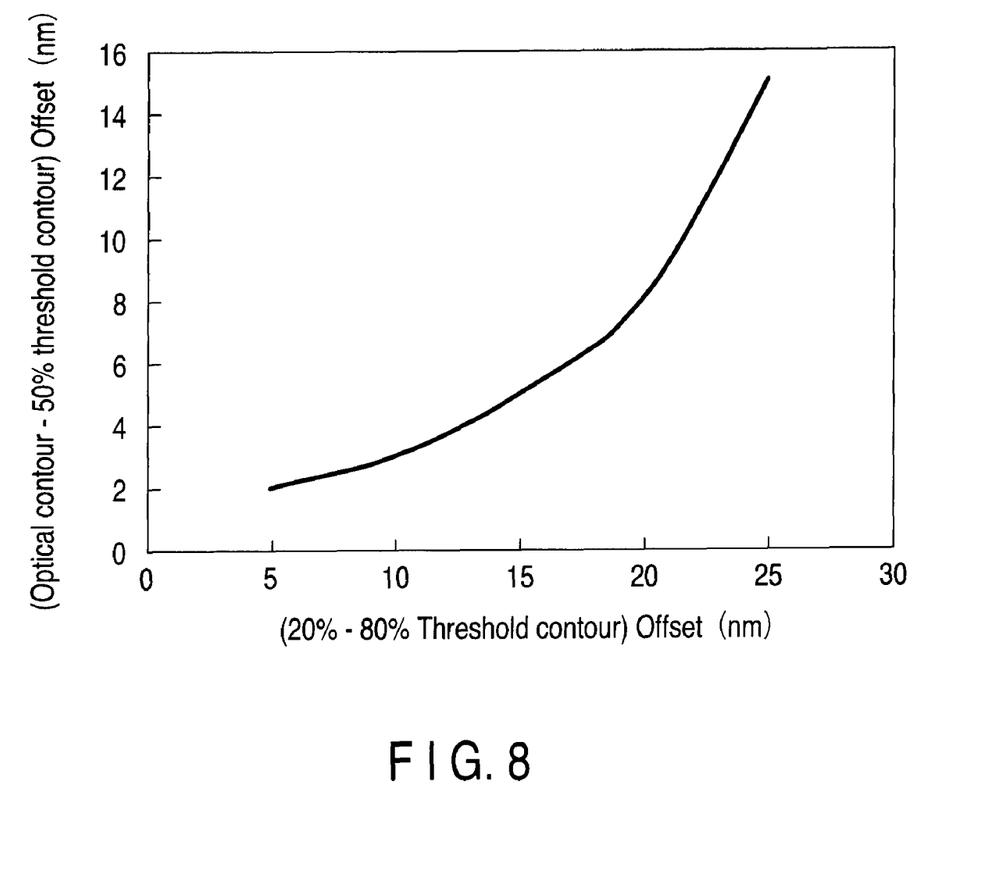
FIG. 8 is a graph showing the sidewall shape correction function.

Furthermore, two items of pattern contour position data are obtained from the SEM image data of the mask patterns using second and third different thresholds for each mask pattern image data. Contour position difference data is then obtained using the two items of pattern contour position data. As an example, when the offset obtained for each mask pattern image data is plotted against the contour position difference data, such a graph as shown in FIG. 8 will be obtained. A function representing such a correspondence is created as the sidewall shape correction function and stored in the memory module 15.

The method will be described in more detail. First, as the photomask 11 used to obtain the sidewall shape correction function, an ArF halftone photomask fabricated by a standard photomask manufacturing process is prepared. The photomask 11 is formed with a plurality of photomask patterns each of which contains a plurality of areas which are greatly different in numerical aperture and is therefore formed to have different sidewall shapes. Thereby, the photomask 11 is prepared which has a plurality of ArF halftone patterns which are different in sidewall shape according to the numerical apertures of patterns.

Figure 3A:
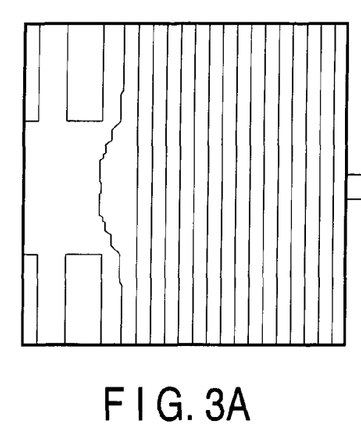
FIG. 3A shows an SEM image of a photomask obtained by an SEM apparatus set in the mask pattern dimensional inspection apparatus of FIG. 1.

The ArF halftone photomask 11 thus prepared is set in a high-definition SEM apparatus made by, for example, Topcon Corp. (product name: NGR4000) as the mask pattern image data acquisition module 12 of FIG. 1 to obtain SEM image data for multiple mask patterns. The apparatus NGR4000 is an SEM apparatus which is capable of obtaining high-definition images of 8000×8000 pixels. Each of the pixels has a high resolution of 2 nm on the photomask 11. That is, the field of view of an SEM image obtained corresponds to 16-μm square on the mask 11, which is sufficient to obtain the sidewall shape correction function used to carry out lithographic simulation. An example of an SEM image obtained is illustrated in FIG. 3A. An example of a contour image extracted from that SEM image is shown in FIG. 3B.

Figure 3B:
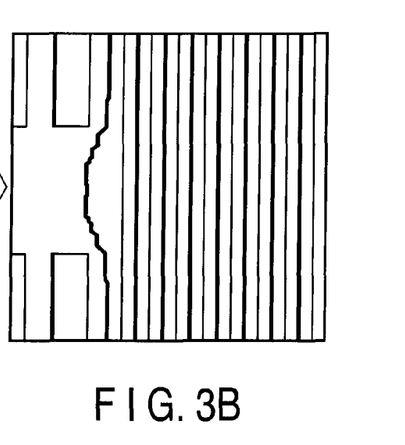
FIG. 3B shows an image of mask pattern contours extracted from the SEM image shown in FIG. 3A.
Figure 4:
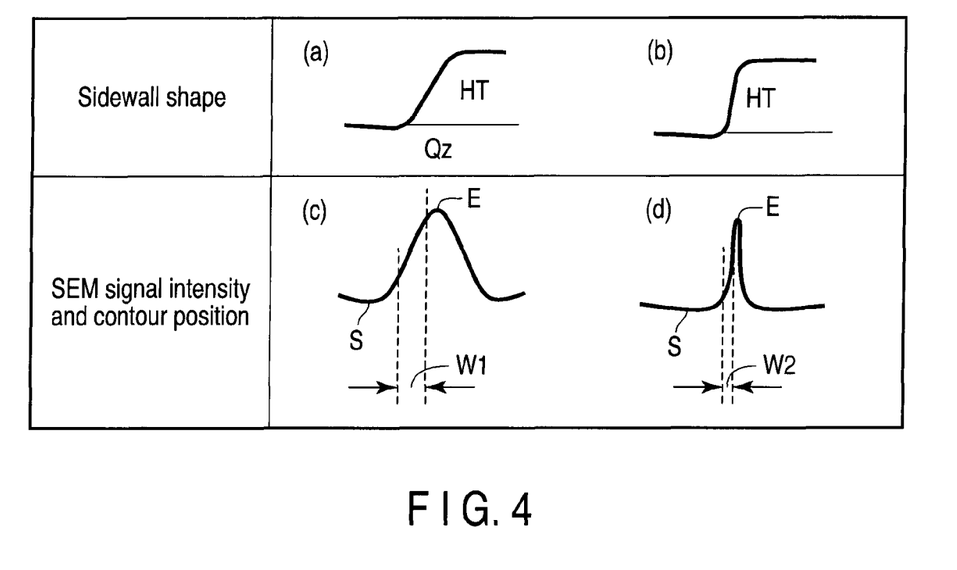
FIG. 4 shows the relationship between mask pattern sidewall shapes and pattern contour positions of the SEM image.

In terms of sidewall shapes, the mask patterns include ones in which the slope of sidewall is relatively gentle as shown in FIG. 4(a), ones in which the slope of sidewall is very steep, or nearly vertical as shown in FIG. 3B, and ones which have a moderate sidewall slope. The contour image shown in FIG. 3B contains mask patterns having such sidewall shapes as shown in FIGS. 4(a) and 4(b). Scanning of a pattern having such a sidewall shape as shown in FIG. 4(a) by the SEM apparatus produces an SEM signal whose intensity rises gently as shown in FIG. 4(c). Therefore, contour position data may be extracted at any point between the starting point S and the ending point of the rising interval of the SEM signal. For example, supposing the waveform amplitude from the starting point S and the ending point E to be 1 (100%), the target contour position is determined by setting a threshold at a given percentage position within a wide range W from a position near the starting point S to a position near the ending point E as shown in FIG. 4(c). With the steep sidewall shown in FIG. 4(b), on the other hand, the rise of an SEM signal waveform from the starting point S to the ending point E is also steep, in which case the target contour position is determined by setting a threshold at a given percentage position within a narrow range W2 shown in FIG. 4(d).

Here, contour data were extracted from SEM image data with three thresholds set to 20%, 50% and 80%. The aforementioned first threshold corresponds to 50%. Second and third thresholds correspond to 20% and 80%, respectively. This is equivalent to that, with the darkest and brightest portions in the image set to 0% and 100%, respectively, three pattern contours are drawn at positions corresponding in brightness to 20%, 50% and 80%. In this example, the first threshold is set midway between the second and third thresholds. However, it is only required that the first threshold be set between the second and third thresholds. For example, the first threshold is allowed to be equal to the second or third threshold. The mask pattern is formed, as shown in FIGS. 4(a) and 4(b), into a forwardly tapered shape to have a slope facing the side being scanned by an electron beam in the SEM apparatus. In an SEM image, therefore, a pattern contour portion corresponding to that slope has a constant brightness and looks shiny in the form of a stripe. For this reason, the width of the stripe will change between the sidewall shapes shown in FIGS. 4(a) and 4(b).

For this reason, when the pattern contours are determined at positions corresponding to two thresholds of 20% and 80% as the second and third thresholds, the difference W2 between the two contours when the width of the stripe with a constant brightness is narrow is small as shown in FIG. 4(d). When the width of the stripe is wide, the difference W1 between the two contours becomes large. Thus, when pattern contour position data are extracted from an SEM image of mask patterns with different sidewall shapes using two different thresholds in step S1 of FIG. 2, the sidewall shapes are reflected in the magnitude of the difference between contour positions drawn with two thresholds.

Figure 5:
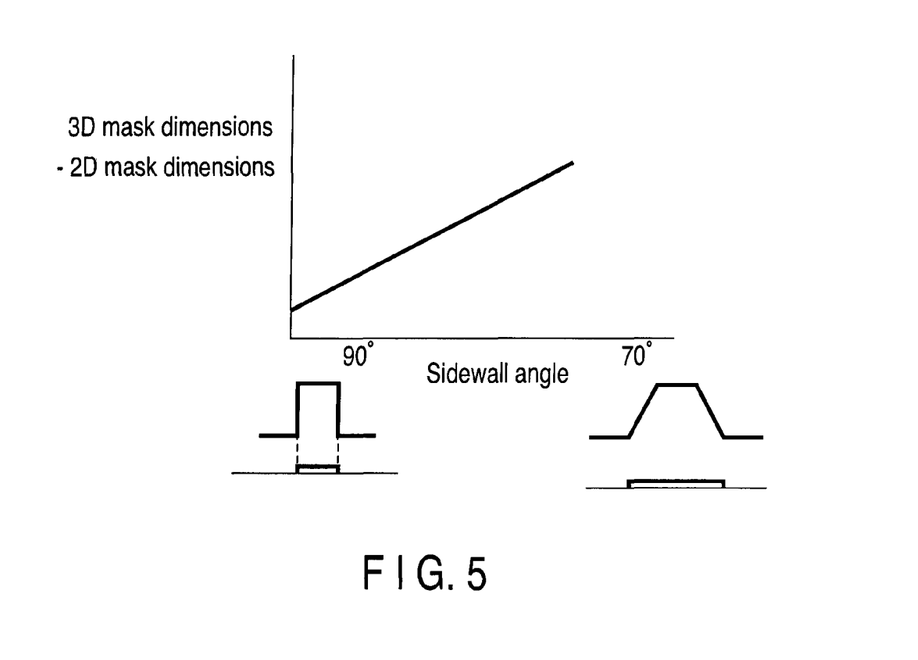
FIG. 5 is a graph showing the relationship between the angle of mask pattern sidewall slope and the error in the mask dimension measurement.

Here, the sidewall shape, i.e., the angle of the sidewall slope and the measured dimensions of mask patterns are related as shown in FIG. 5. In this diagram, the sidewall angles are shown on the horizontal axis and the difference values between three-dimensional (3D) dimensions of mask patterns measured with the photomask thickness taken into consideration and the two-dimensional (2D) pattern dimensions measured without taking the photomask thickness into consideration are shown on the vertical axis. It can been seen that the pattern of the sidewall shape shown in FIG. 4(b) in which the sidewall angle is nearly 90 degrees is smaller in the difference (3D-2D) between three- and two-dimensional measured values than the pattern shown in FIG. 4(a) in which the sidewall is gentle and its angle is in the vicinity of, say, 70 degrees, in other words, the former is smaller in measurement error than the latter. Therefore, it can been seen that, since the magnitude of the difference between contour positions drawn with two thresholds reflects sidewall shapes, the target sidewall shape correction function can be determined by associating data representing the difference and optically determined contour position data.

In general, the photomask is handled as a two-dimensional mask with no thickness in the lithographic simulation. That is, the mask pattern is simply handled on the assumption that a contour exists at the boundary between a portion that allows light to pass through and a portion that block light. For this reason, a calculation model applied to a two-dimensional mask is used in the lithographic simulation. Contour data from a mask SEM image input at the time of the lithographic simulation is required not to cause contradiction when handled as a mask of no thickness. To this end, the area from which an SEM image of the halftone mask has been obtained is image-scanned by a spatial image inspection apparatus (AIMS193: product of Karl Zeiss Corp.) to obtain a spatial image comparable to one formed on the wafer in step S1 of FIG. 2. Next, a lithographic simulation is carried out using the lithographic simulator module 16 shown in FIG. 1 to obtain pattern contour data of a mask with no thickness to obtain a spatial image which matches that spatial image. In other words, when the mask pattern spatial image obtained using the spatial image inspection apparatus matches a spatial image obtained by applying the same lithographic simulation as one applied to quasi-optical contour position data (which will be described later) to the optical contour position data, the pattern contour data obtained as described above is defined as optical pattern contour data.

Figure 6:
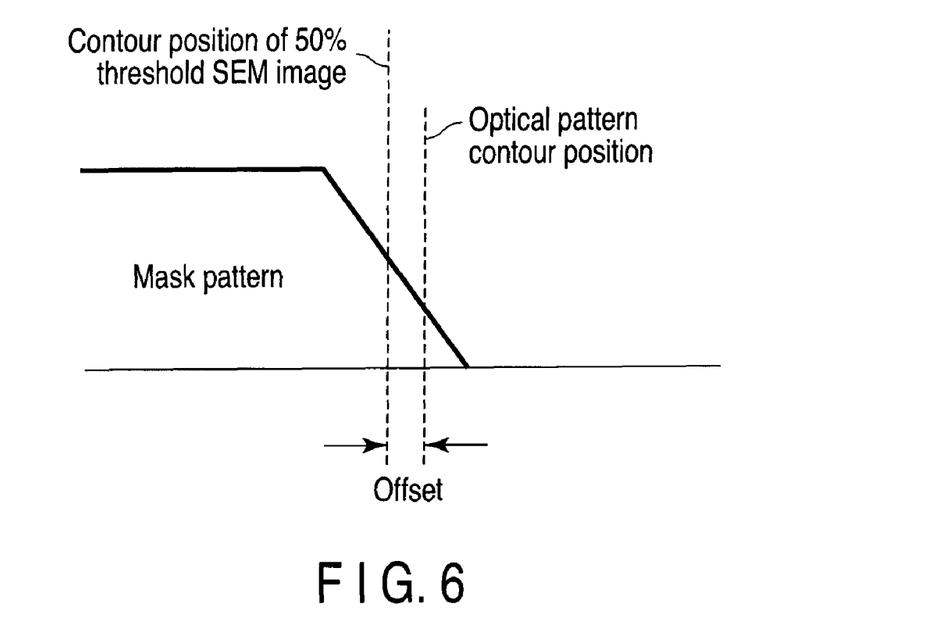
FIG. 6 shows the relationship between the SEM image contour position and the optical pattern contour position in the slope of a mask pattern sidewall.
Figure 7:
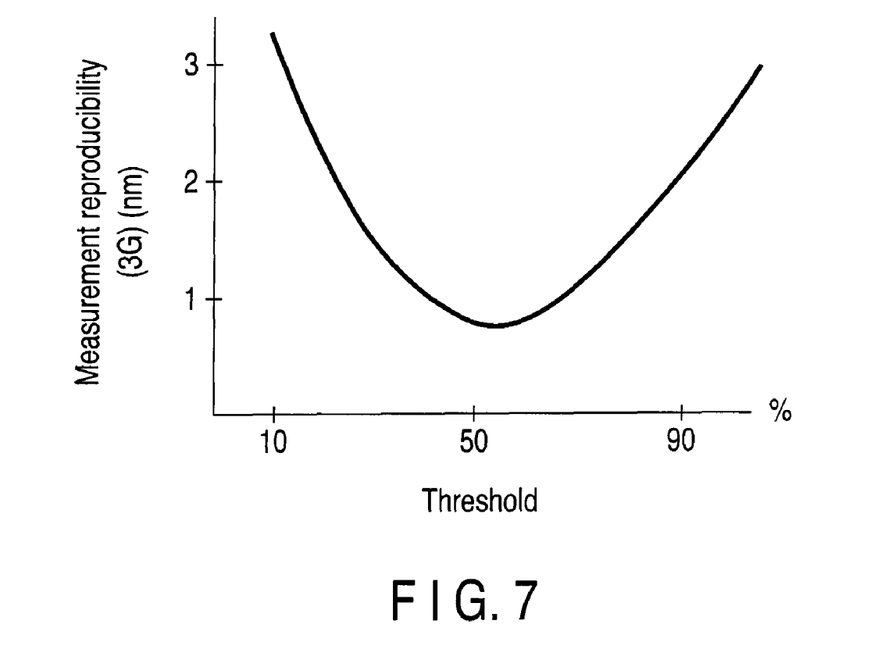
FIG. 7 shows the relationship between the pattern contour position determining threshold and the measurement reproducibility of pattern sidewall shape.

Pseudo-optical pattern contour position data can be obtained by determining the relationship between the optical pattern contour data thus obtained and the pattern contour data obtained from SEM image data as a sidewall shape correction function, then obtaining pattern SEM image data from a photomask on which lithographic simulation is to be performed, and applying pattern contour position data obtained from the SEM image data to the function. To this end, SEM image contour data having a constant offset quantity with respect to the optical pattern contour data, for example, SEM image pattern contour position data with 50% as the first threshold value, is determined. FIG. 6 shows an example of offset between the contour position at the 50% threshold in an SEM image and the optical pattern contour position on the slope of a mask pattern sidewall. Although use may be made of other thresholds in place of 50% as described previously, it is desirable to use the 50% threshold. This is because it has been found that, as shown in FIG. 7, the measurement reproducibility is best at the 50% threshold when three-dimensional pattern contour measurement reproducibility is plotted against the threshold in the range of 10 to 90% and the results of inspection of mask pattern dimensions at this position shows high reliability.

A relationship between the first threshold of 50% and the offset between SEM image contour pattern data at the second and third thresholds of 20% and 80% is determined in advance. An example of such a relationship is shown in FIG. 8. A relationship between multiple items of SEM image pattern contour position data obtained in step S1 and optical pattern contour position data, which is called a sidewall shape correction function, is stored beforehand in the memory 15 in step S2 in the flowchart of FIG. 2. When the offset between SEM image pattern contour position data at the threshold of 50% and optical pattern contour position data is used from FIG. 8, pseudo-optical pattern contour position data can be obtained from the relationship between that offset and the offset between two thresholds which varies with varying pattern sidewall shape. Preparations have been made in steps S1 and S2 for extracting pseudo-optical pattern contour position data from mask SEM image data. In this example, the sidewall shape correction function is determined by using a portion of the mask pattern dimensional inspection apparatus 10.

Alternatively, use may be made of function data obtained in advance by another person besides obtaining by the inspector preparatory to inspection using the inspection apparatus 10.

Figure 2:
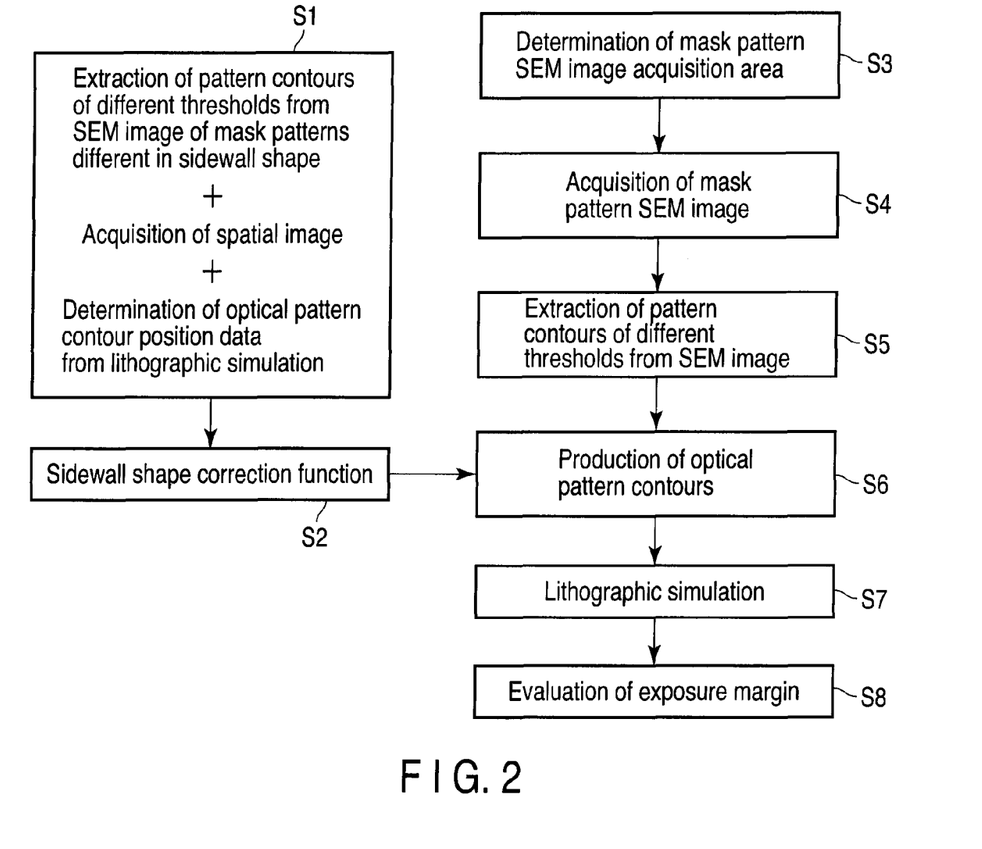
FIG. 2 is a flowchart illustrating the operation of the mask pattern dimensional inspection apparatus under the control of the computer shown in FIG. 1.

Reference is next made to FIG. 2 to describe an example of verification of pattern dimensions of the photomask 11 used in manufacturing an actual device which was conducted using the mask pattern dimensional inspection apparatus 10 under control of the computer 17 shown in FIG. 1. In FIG. 1, an ArF halftone (HT) mask 11 fabricated by a standard photomask manufacturing process was prepared as a subject of inspection. In this case, the mask pattern formed on the photomask 11 is for memory devices of 45 nm design rules. To select mask pattern SEM image acquisition areas in step S3 of FIG. 2, spots each having a little lithographic margin (referred to as hotspots) had been extracted in advance. The hotspots are extracted by identifying spots having little lithographic margin from design data subjected to optical proximity correction (OPC) through lithographic simulation over the entire surface of a memory chip. In this example, 64 hotspots were extracted.

Next, in step S4, the prepared ArF-HT mask 11 was set in the high-definition SEM apparatus (NGR400) manufactured by Topcon Corp. in the mask pattern image acquisition module 12 to obtain mask pattern image data as a hotspot SEM image. The mask pattern image data thus obtained corresponds to the image shown in FIG. 3A by way of example. The image data was applied to the pattern contour extraction module 13, where three items of pattern contour position data of thresholds 20%, 50% and 80% were extracted through the use of contour extraction software used with a processor in the module 13 (step S5). In FIG. 3B, there is illustrated only the contour position data of 50% threshold.

Next, the three items of pattern contour position data were applied to the pseudo-optical pattern contour position data production module 14. In this unit, the offset between contour positions of the two items of pattern contour position data of thresholds of 20% and 50% obtained in step S5 was calculated and applied to the graph of FIG. 8 representing the sidewall shape correction function obtained in step S2 and stored in the memory module 15 (e.g., a table memory) to determine that offset on the vertical axis of the graph which corresponds to the calculated offset (step S6). The offset on the vertical axis is, as described previously, the offset between optical contour position data determined by an optical method and SEM-image-based pattern contour position data of threshold 50%. Therefore, adding the offset thus determined to the pattern contour position data of threshold 50% in step S6 produces new pseudo-optical pattern contour position data.

Next, in step S7, the pseudo-optical pattern contour position data thus obtained was input to the lithographic simulator module 16 where a lithographic simulation was conducted under optical conditions when the fabricated photomask 11 is actually used to expose a wafer. Then, the exposure margin was evaluated in step S8. As a result, it turned out that the exposure tolerance allowing for desired pattern dimensions on a wafer was 8% and the depth of focus was 0.21 μm. Since it is required that the exposure tolerance be 10% and the depth of focus be 0.2 μm, this photo-mask was therefore found to be defective since its hotspots do not meet the specifications in terms of exposure tolerance. For comparison, when the same simulation was carried out with SEM image pattern contour position data of 50% threshold, the resulting exposure tolerance was 11% and the depth of focus was 0.23 μm, showing a good product. Accordingly, a resist pattern was actually formed on a wafer using this photomask. The exposure apparatus was an immersion exposure apparatus manufactured by Nikon Corp. and the numerical aperture (NA) was 1.3. Polarizing illumination was also adopted for exposure. As a result, the range of exposure for desired dimensions was 8% and the depth of focus was 0.22 μm. With exposure, such as immersion exposure, in which the numerical aperture is large, the influence of the sidewall angle of the photomask 11 increased. Allowing for variations in mask pattern sidewall angle made it possible to conduct lithographic simulation more faithfully and to increase the accuracy of evaluation of the quality of masks.

The present invention is not limited to the above-described embodiment. For example, the thresholds may be set to other values than 20, 50 and 80% and moreover their number may be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern dimensional inspection method comprising:
   preparing a sidewall shape correction function by, using an optical method, determining contour position data of a plurality of mask patterns which are different in sidewall shape and formed on a photomask as optical contour position data, obtaining SEM image data of the mask patterns, obtaining a plurality of items of pattern contour position data corresponding to the mask patterns from the SEM image data using a first threshold, determining an offset between the pattern contour position data obtained for each of the mask patterns using the first threshold and the corresponding optical contour position data, obtaining two items of pattern contour position data from the SEM image data for each of the mask patterns using second and third thresholds, obtaining contour position difference data between the two items of pattern contour position data obtained for each of the mask patterns using the second and third thresholds, and determining the sidewall shape correction function representing the correspondence between the offset and the contour position difference data obtained for each mask pattern;
   obtaining an SEM image of a pattern to be inspected;
   obtaining pattern contour position data from the SEM image of the pattern to be inspected using the first, second and third thresholds;
   obtaining position contour position difference data between two items of pattern contour position data obtained from the SEM image of the pattern to be inspected using the second and third thresholds;
   obtaining an offset corresponding to the pattern contour position difference data by referring to the sidewall shape correction function;
   determining pseudo-optical contour position data by adding the resulting offset to the pattern contour position data obtained from the SEM image of the pattern to be inspected using the first threshold; and
   conducting a lithographic simulation of the pattern to be inspected using the pseudo-optical contour position data.

2. The method according to claim 1, wherein the optical contour position data of the mask patterns are determined so that an spatial image obtained by applying the same lithographic simulation as the lithographic simulation applied to the pseudo-optical contour position data to the optical contour position data matches a spatial image of the mask patterns obtained by using a spatial image inspection apparatus.

3. The method according to claim 2, wherein a computation model applied to a two-dimensional mask is used in the lithographic simulation.

4. The method according to claim 1, wherein the first threshold is set to a middle value of a range of brightness in the SEM image.

5. The method according to claim 1, wherein each of the mask patterns formed on the photomask contains a plurality of contour areas different in numerical aperture.

6. The method according to claim 5, wherein the mask patterns have sidewalls formed as slopes ranging from a nearly vertical one to a gentle one, and the numerical aperture varies according to the slopes of the sidewalls.

7. The method according to claim 1, wherein the sidewall shape correction function is prepared on an assumption that an intermediate portion of the sidewall slope between its bottom and top ends is formed substantially linearly.

8. The method according to claim 7, wherein the first, second and third thresholds are determined within the intermediate portion of the sidewall slope.

9. The method according to claim 4, wherein the sidewall slope is displayed in the SEM image as a stripe-like image having a constant brightness, and the middle value in the range of brightness is the value at almost a center of the stripe-like image.

10. The method according to claim 1, wherein the sidewall shape correction function is stored in advance as data representing the same.

11. A mask pattern dimensional inspection apparatus comprising:
a module configured to read a sidewall shape correction function obtained by, using an optical method, determining contour position data of a plurality of mask patterns which are different in sidewall shape and formed on a photomask as optical contour position data, obtaining SEM image data of the mask patterns, obtaining a plurality of items of pattern contour position data corresponding to the mask patterns from the SEM image data using a first threshold, determining an offset between the pattern contour position data obtained for each of the mask patterns using the first threshold and the corresponding optical contour position data, obtaining two items of pattern contour position data from the SEM image data for each of the mask patterns using second and third thresholds, obtaining contour position difference data between the two items of pattern contour position data obtained for each of the mask patterns using the second and third thresholds, and determining the sidewall shape correction function representing the correspondence between the offset and the contour position difference data obtained for each mask pattern;
a module configured to obtain an SEM image of a pattern to be inspected;
a module configured to obtain pattern contour position data from the SEM image of the pattern to be inspected using the first, second and third thresholds;
a module configured to obtain position contour position difference data between two items of pattern contour position data obtained from the SEM image of the pattern to be inspected using the second and third thresholds;
a module configured to obtain an offset corresponding to the pattern contour position difference data by referring to the sidewall shape correction function;
a module configured to determine pseudo-optical contour position data by adding the resulting offset to the pattern contour position data obtained from the SEM image of the pattern to be inspected using the first threshold; and
a module configured to conduct a lithographic simulation of the pattern to be inspected using the pseudo-optical contour position data.

12. The apparatus according to claim 11, further comprising a module configured to determine in advance the optical contour position data of the mask patterns so that an spatial image obtained by applying the same lithographic simulation as the lithographic simulation applied to the pseudo-optical contour position data to the optical contour position data matches a spatial image of the mask patterns obtained by using a spatial image inspection apparatus.

13. The apparatus according to claim 12, further comprising a module configured to conduct the lithographic simulation using a computation model applied to a two-dimensional mask.

14. The apparatus according to claim 11, further comprising a module configured to obtain the offset using a middle value of the range of brightness in the SEM image as the first threshold.

15. The apparatus according to claim 11, wherein each of the mask patterns formed on the photomask contains a plurality of contour areas different in numerical aperture.

16. The apparatus according to claim 15, wherein the mask patterns have sidewalls formed as slopes ranging from a nearly vertical one to a gentle one, and the numerical aperture varies according to the slopes of the sidewalls.

17. The apparatus according to claim 11, wherein the sidewall shape correction function is prepared on an assumption that an intermediate portion of the sidewall slope between its bottom and top ends is formed substantially linearly.

18. The apparatus according to claim 17, wherein the first, second and third thresholds are determined within the intermediate portion of the sidewall slope.

19. The apparatus according to claim 14, wherein the sidewall slope is displayed in the SEM image as a stripe-like image having a constant brightness, and the middle value in the range of brightness is the value at almost a center of the stripe-like image.

20. The apparatus according to claim 11, further comprising a module configured to store the sidewall shape correction function in advance as data.

* * * * *

UNITED STATES PATENT AND TRADEMARK OFFICE
CERTIFICATE OF CORRECTION

| | | |
|---|---|---|
| PATENT NO. | : 8,023,723 B2 | Page 1 of 1 |
| APPLICATION NO. | : 12/268003 | |
| DATED | : September 20, 2011 | |
| INVENTOR(S) | : Ito | |

It is certified that error appears in the above-identified patent and that said Letters Patent is hereby corrected as shown below:

Claim 2, column 8, line 67, change "an spatial" to --a spatial--.

Claim 12, column 10, line 21, change "an spatial" to --a spatial--.

\* Claim 14, column 10, line 33, change "value of the range" to --value of a range--.

Signed and Sealed this
Tenth Day of January, 2012

David J. Kappos
*Director of the United States Patent and Trademark Office*